(12) United States Patent  (10) Patent No.: US 7,439,773 B2
Or-Bach et al.  (45) Date of Patent: Oct. 21, 2008

(54) INTEGRATED CIRCUIT COMMUNICATION TECHNIQUES

(75) Inventors: Zvi Or-Bach, San Jose, CA (US); Adrian Apostol, Iasi (RO); Laurence H. Cooke, Los Gatos, CA (US)

(73) Assignee: cASIC Corporation, Santa Clara, CA (US)

( * ) Notice: Subject to any disclaimer, the term of this patent is extended or adjusted under 35 U.S.C. 154(b) by 108 days.

(21) Appl. No.: 11/246,294

(22) Filed: Oct. 11, 2005

(65) Prior Publication Data

US 2007/0080709 A1    Apr. 12, 2007

(51) Int. Cl.
*H03K 19/00*    (2006.01)
(52) U.S. Cl. ............................ 326/93; 326/86; 326/115; 326/21; 327/141; 327/172
(58) Field of Classification Search .................. 326/86, 326/115, 121, 126, 93; 333/26; 375/257; 327/141, 172
See application file for complete search history.

(56) References Cited

U.S. PATENT DOCUMENTS

| 4,991,141 | A | 2/1991 | Tran |
| 5,963,495 | A | 10/1999 | Kumar |
| 6,281,704 | B2 * | 8/2001 | Ngai et al. ................ 326/41 |
| 6,388,495 | B1 | 5/2002 | Roy et al. |
| 6,492,881 | B2 * | 12/2002 | Wright et al. ............. 333/26 |
| 6,529,085 | B2 | 3/2003 | Hajimiri et al. |
| 6,556,628 | B1 | 4/2003 | Poulton et al. |
| 6,651,237 | B2 | 11/2003 | Cooke et al. |
| 6,703,907 | B1 | 3/2004 | Van Der Wagt |
| 6,815,980 | B2 | 11/2004 | Kerr |
| 7,142,061 | B2 * | 11/2006 | Storino ....................... 330/301 |
| 2005/0033902 | A1 * | 2/2005 | Tamura ........................ 711/2 |
| 2005/0040846 | A1 * | 2/2005 | Otsuke et al. ............... 326/31 |
| 2005/0179465 | A1 * | 8/2005 | Otsuka et al. ............... 326/86 |
| 2005/0237088 | A1 | 10/2005 | Burleson et al. |
| 2006/0215769 | A1 * | 9/2006 | Haridass et al. ............ 375/257 |

OTHER PUBLICATIONS

Shina, M. et al., "Current-Sensing for Crossbars", University of Massachusetts, Amherst, MA, pp. 1-5, date unknown.
Maheshwari, A. et al., "Current Sensing Techniques for Global Interconnects in Very Deep Submicron (VDSM) CMOS," University of Massachusetts, Amherst, MA (5 pages), date unknown.
Mizuno M. and Dally, W.J., "Elastic Interconnects: Repeater-Inserted Long Wiring Capable of Compressing and Decompressing Data", 2001 ISSCC, Feb. 2001, pp. 346-347.

* cited by examiner

*Primary Examiner*—Vibol Tan
(74) *Attorney, Agent, or Firm*—Connolly Bove Lodge & Hutz LLP

(57) ABSTRACT

An semiconductor device, containing logic blocks and high speed connections between the blocks, where the connections utilize current direction for logic representation rather than voltage level. Such high speed connections comprise differential transmitters which drive a pair of adjacent wires with differential current pulses that are received by a differential receiver which may be put in a low power state between transmissions.

21 Claims, 12 Drawing Sheets

Optical Clock Distribution

Exemplary Optical Clock Distribution

INTEGRATED CIRCUIT COMMUNICATION TECHNIQUES

FIELD OF THE INVENTION

The present invention relates to integrated circuit (IC) devices as well as to methods for transmitting and receiving signals within such integrated circuit devices.

BACKGROUND OF THE INVENTION

The following U.S. patents are believed to represent the current state of the art: U.S. Pat. Nos. 5,963,495, 6,703,907, 6,529,085, 6,815,980, 6,388,495, and 6,556,628. These patents all relate to prior art with respect to the current patent.

When semiconductor's smallest dimensions were much larger than a micron, line spaces and widths for the metal interconnect between the transistors were much larger than their thickness. Also there were only a few layers of metal. As a result signals propagated down wires in a fashion similar to a resistive transmission line. The primary components of delay at that time were the capacitance to the ground plane and the resistance of the wire.

FIG. 1 shows a side view of such wires 10 and vias 11 between two layers 12 of metal.

Typically, when multiple layers of metal were used, they were organized in parallel tracks on each layer, and perpendicular to each other. FIG. 2 shows such a structure with vertical wire segments 20 on one layer, and horizontal segments 21, on a different layer, interconnected with vias 22.

As the dimensions shrank and the number of metal interconnect layers grew, the capacitance due to the adjacent wires became more significant, and efforts began to reduce the dielectric constant of the insulating glass.

Reference is now made to FIG. 3, a cross section of two layers 32, of interconnect wire in a deep sub-micron process. Now that current dimensions are below 0.1 microns, the effort to minimize the resistance has resulted in constructing wires 30, which are much thicker than they are wide, with spaces that are much closer than the distances between the layers. As a result the sidewall capacitance is much more significant than the ground plane capacitance.

As semiconductor dimensions have continued to shrink, the device delays continue to shrink as well, but the inevitable increases in capacitance and resistance due to these smaller dimensions have now kept the wire interconnect delay relatively constant, even though the average wire length continues to shrink with the chips.

It has gotten to the point at 100 nanometer (0.1 micron) dimensions, where the wire delay is greater than the device delay, and long wire signal propagation delay is now over 10 clock cycles on high performance chips.

Furthermore, the side wall capacitance couples the signals between adjacent wires, and while most wire segments 40 as shown in FIG. 4, are short, there are an increasing number of long segments 41 that are adjacent to each other over a long enough length to cause significant enough capacitive coupling, to functionally fail in normal operation.

Traditionally, transmitters on long lines are designed with high drive to charge up the line as quickly as possible and receivers are designed with thresholds in the mid range of their voltage swings for maximum noise immunity, which means the line must be charged past mid voltage before the receiver switches. The added capacitance and resistance of the wires in sub 100 nanometer processes has slowed this charging and discharging even as the transmitter's drive increases due to the shorter gate lengths, resulting in longer delays for these long lines.

A different approach is needed to constructing long metal interconnects on deep sub-micron Integrated Circuits (ICs). Such a structure must be more immune to adjacent wire cross talk, propagate signals at much higher velocity than current interconnects, while sustaining the fast transition times the current devices are capable of, and receivers must be used that sense the significantly attenuated signals that arrive at the other end of the long metal lines.

Typically long metal interconnects on ICs have high resistive and capacitive losses, which severely degrades their transition times and propagation delays, as well as making them subject to adjacent signal inductive and capacitive coupling. Instead, using tightly coupled transmission lines has the advantage of limiting the impedance to the differential characteristics of the line, predominantly the coupling capacitance between the two lines. Furthermore, because the differential signals cancel, the EMI losses are minimized, reducing the aggressor and victim cross talk characteristics in adjacent lines. Also inductive coupling tends to preserve rather than impede the transitions on the lines. The propagation time is improved, since differential transmission signal velocity is higher than common transmission signal velocity.

Lastly, when current is sensed by differential receivers, rather than voltage on single ended receivers, the receivers can be designed to switch on the first incident of the signals, as opposed to waiting until the voltage passes the threshold of the device, which will only occur after the long line is sufficiently charged up.

Prior art covers the concepts of transmission lines and differential current receivers, but not the concept of applying these to on-chip communications. Tran in U.S. Pat. No. 4,991,141, granted Feb. 5, 1991, and Kumar in U.S. Pat. No. 5,963,495, granted Oct. 5, 1999, talk about differential receivers for use in memories. Others such as van der Wagt in U.S. Pat. No. 6,703,907, granted Mar. 9,2004, and Hajimiri et al. in U.S. Pat. No. 6,529,085, granted Mar. 4, 2003, talk about using differential transmission lines for various analog devices, while Kerr in U.S. Pat. No. 6,815,980, granted Nov. 9, 2004, and Roy, et al. in U.S. Pat. No. 6,388,495, granted May 14, 2002, discuss the need for differential transmission line drivers and receivers for chip to chip communication. Also, Poulton, et al. in U.S. Pat. No. 6,556,628, granted Apr. 29, 1999, describe the need for getting more bandwidth out of off chip differential transmission lines because of the chip to chip bandwidth issue. They do not talk about using differential transmission lines for internal chip communication, because up to now there has not been an on-chip bandwidth issue. In fact, M. Mizuno and W. J. Dally present a case in, "Elastic Interconnects: Repeater-Inserted Long Wiring Capable of Compressing and Decompressing Data," 2001 ISSCC, Feb. 2001, pp. 346-347, for improving on-chip long wire performance by inserting a large number of repeaters into the wires, which takes more transistors and wire. Clearly the problem is not bandwidth, but performance.

As the dimensions shrink and the number of interconnect layers grows, there is plenty of space for on-chip interconnect, but without improvements such as described in this disclosure, the performance of Integrated Circuits will not be improved by going to smaller process dimensions.

The solution is to use differential current sensing receivers coupled with differential transmitters for global interconnect as described in "Current Sensing Techniques for Global Interconnects in Very Deep Submicron (VDSM) CMOS", by Atul Maheshwari and Wayne Burleson, of Dept. of Electrical &

Computer Engineering, University of Massachusetts, Amherst MA. Burleson further defines an improved current sensing device in "Current-Sensing for Crossbars*", by Manoj Sinha and Wayne Burleson, of Dept. of Electrical & Computer Engineering, University of Massachusetts, Amherst Mass. This patent expands on this initial work.

SUMMARY OF THE INVENTION

The present invention seeks to provide an improved integrated circuit, which, in addition to the teachings of the prior art, contains logic blocks and high speed connections between the blocks, where the connections utilize current direction for logic representation rather than voltage level. Such high speed connections consist of differential transmitters, which drive a pair of adjacent wires with differential current pulses that are received by a differential receiver, which may be put in a low power state between transmissions.

There is thus provided in accordance with a preferred embodiment of the present invention a semiconductor device comprising a multiplicity of logic blocks, and connections between said blocks where at least one of the connections includes, a differential driver, two wires adjacent to each other, and at least one clocked current sensing receiver, which are connected so as to transmit and receive differential current pulses for the purposes of transferring data between the logic blocks, and clocked to reduce power.

Furthermore, the current sensing receiver includes, differential inputs, a clock input, a latch, and a differential receiver, where the differential receiver is disabled by a signal from a clock input, to reduce the power consumed by the receiver when not receiving data, and the transmitter may transmit multiple bits of data on the two wires prior to the current sensing receiver receiving the first bit of data.

In addition, the two adjacent wires may be, either separated from other wires on the integrated circuit by a distance greater than the spacing between the adjacent wires, or may be separated from other wires on the integrated circuit by wires connected to ground.

There is also provided, in accordance with another preferred embodiment of the present invention, a semiconductor device including a first logic block, a second logic block, and a high speed connection for transferring logic information from the first to the second logic block, where the logic information is represented by the direction of current. The second logic block includes a receiver to convert the direction of current to a normal voltage level logic representation and is powered for a small period of time to save power.

In addition, the second logic includes a register to capture the information, and a clock distribution system for distributing the clock, possibly using pulses of light, where the clock is used to synchronize the powering of the receiver and the timing of the capturing.

Also, the high speed connection may include two wires, which have larger spacing to adjacent signals than to each other. The first logic block may include a transceiver to convert normal voltage level logic representations to the direction of current logic representations.

The semiconductor device may also include a clock distribution, which may distribute the clock using pulses of light, where the resulting clock is used to synchronize the transceiver and the powering of the receiver.

In addition, the semiconductor device may include drivers to redrive the signals on two wires.

There is also provided, in accordance with yet another preferred embodiment of the present invention, an automated design tool that can synthesize and place a design starting from a high level design description so that, when two logic blocks are placed far apart and a high speed connection is required from one logic block to a second logic block, then the synthesis and placement is done such that the second logic block will include a latch or a flip flop as part of the very first logic elements connected to the high speed connection

BRIEF DESCRIPTION OF THE DRAWINGS

The present invention will be understood and appreciated more fully from the following detailed description, taken in conjunction with the drawings in which:

FIG. 7b is a transistor diagram of the receiver in FIG. 7a;

DETAILED DESCRIPTION OF PREFERRED EMBODIMENTS

A basic concept in this disclosure is to employ differential drivers and receivers on pairs of differential transmission lines to improve the performance and bandwidth of on-chip long line communications, while keeping the power and interference from external noise to a minimum.

Figure 1:
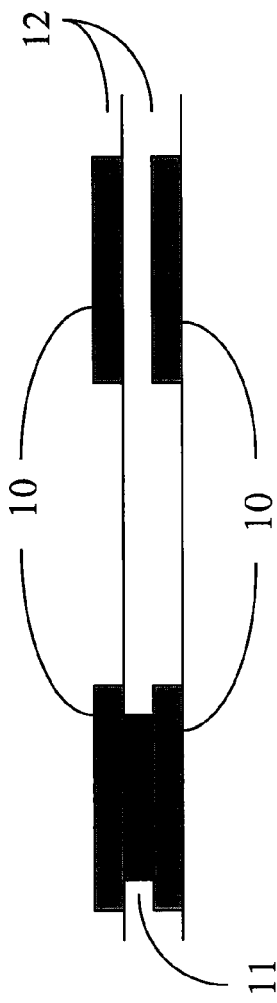
FIG. 1 is a side view diagram of two layers of metal interconnect on an IC.
Figure 3:
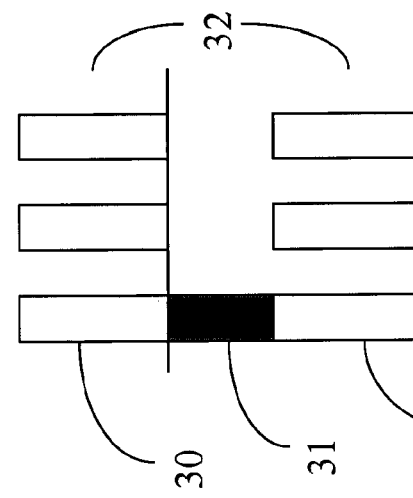
FIG. 3 is another side view diagram of two layers of metal interconnect on an IC.
Figure 2:
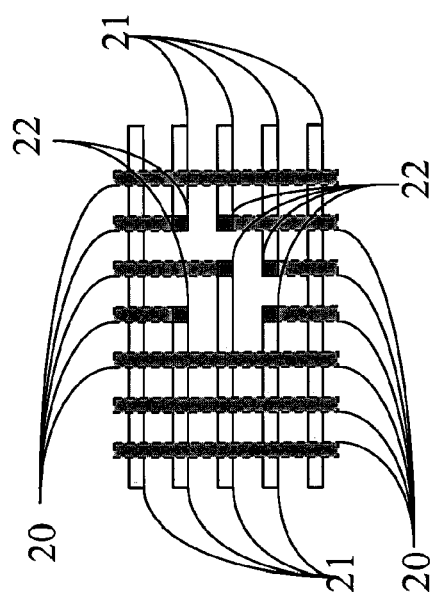
FIG. 2 is a top view diagram of two layers of metal interconnect on an IC.
Figure 4:
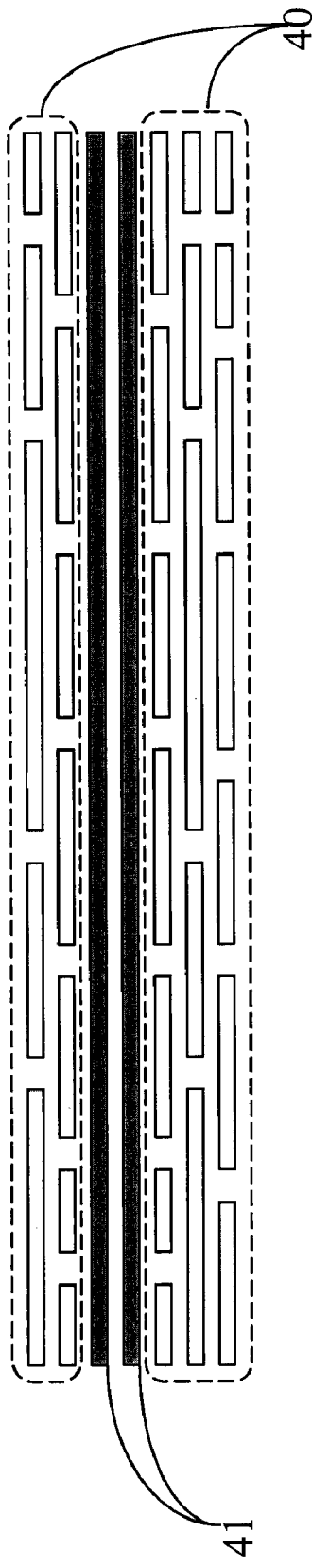
FIG. 4 is a top view diagram of a single layer of metal interconnect on an IC, consisting of a pair of long segments and a multiplicity of short segments.
Figure 5:
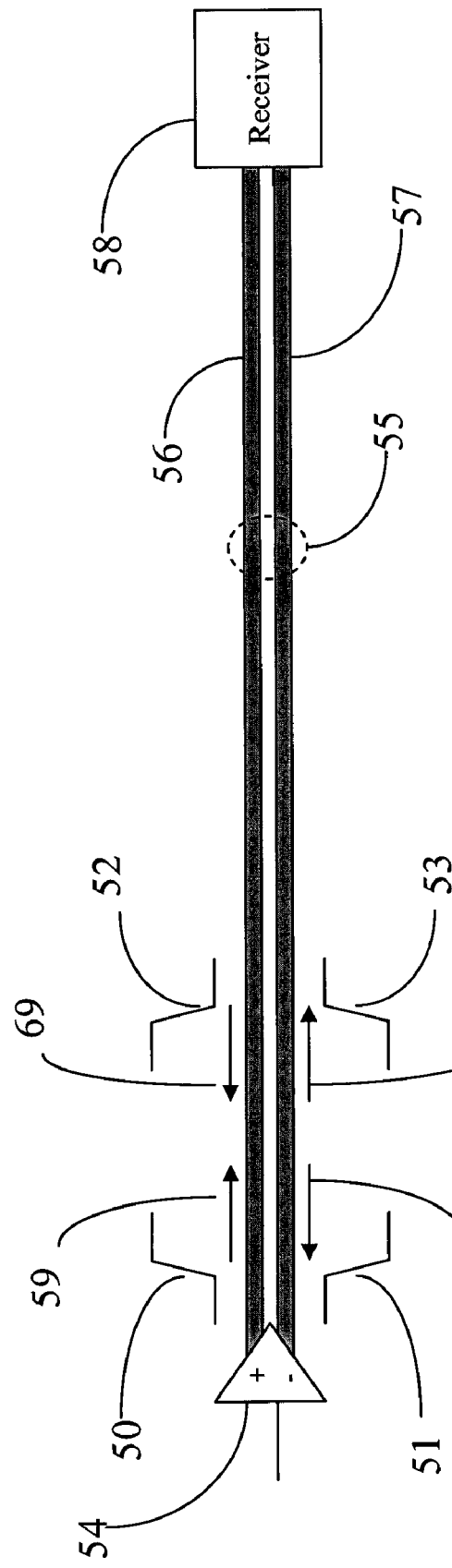
FIG. 5 is a diagram of a differential connection on an IC consisting of a differential transmitter, a pair of metal interconnects, and a receiver.

Reference is now made to FIG. 5. In one embodiment of the present invention, a differential voltage signal up 50, 51 or down 52,53 is generated by a differential driver 54, down a differential transmission line 55, further comprised of a positive 56, and a negative 57 wire, both going to a receiver 58. More importantly along with the voltage, the differential driver 54 generates corresponding current 59,67 going in the opposite directions for a signal up, and reversing directions 69,68 for a signal down. The differential signal up is comprised of positive current 59 on the positive line 56, and negative current 67 on the negative line 57. The differential signal down is comprised of a negative current 69 on the positive line 56, and a positive current 68 on the negative line 57. In board technology these signals have typically transitioned from ground to some power voltage, or vice versa, but it is more desirable that the transitions occur around some mid voltage, where the current is zero on both lines. Ideally, the signals may also not drive from this mid voltage to ground and power, but rather with a properly constructed transmission line and receiver, they may transition to some lower and higher voltage from the mid voltage, but less than ground and power, whatever is necessary to generate sufficient current to be detected by the receiver at the other end of the line.

In either case the important aspect is the current, which flows in equal and opposite directions between the pair of wires when a signal of either polarity is present.

Figure 6:
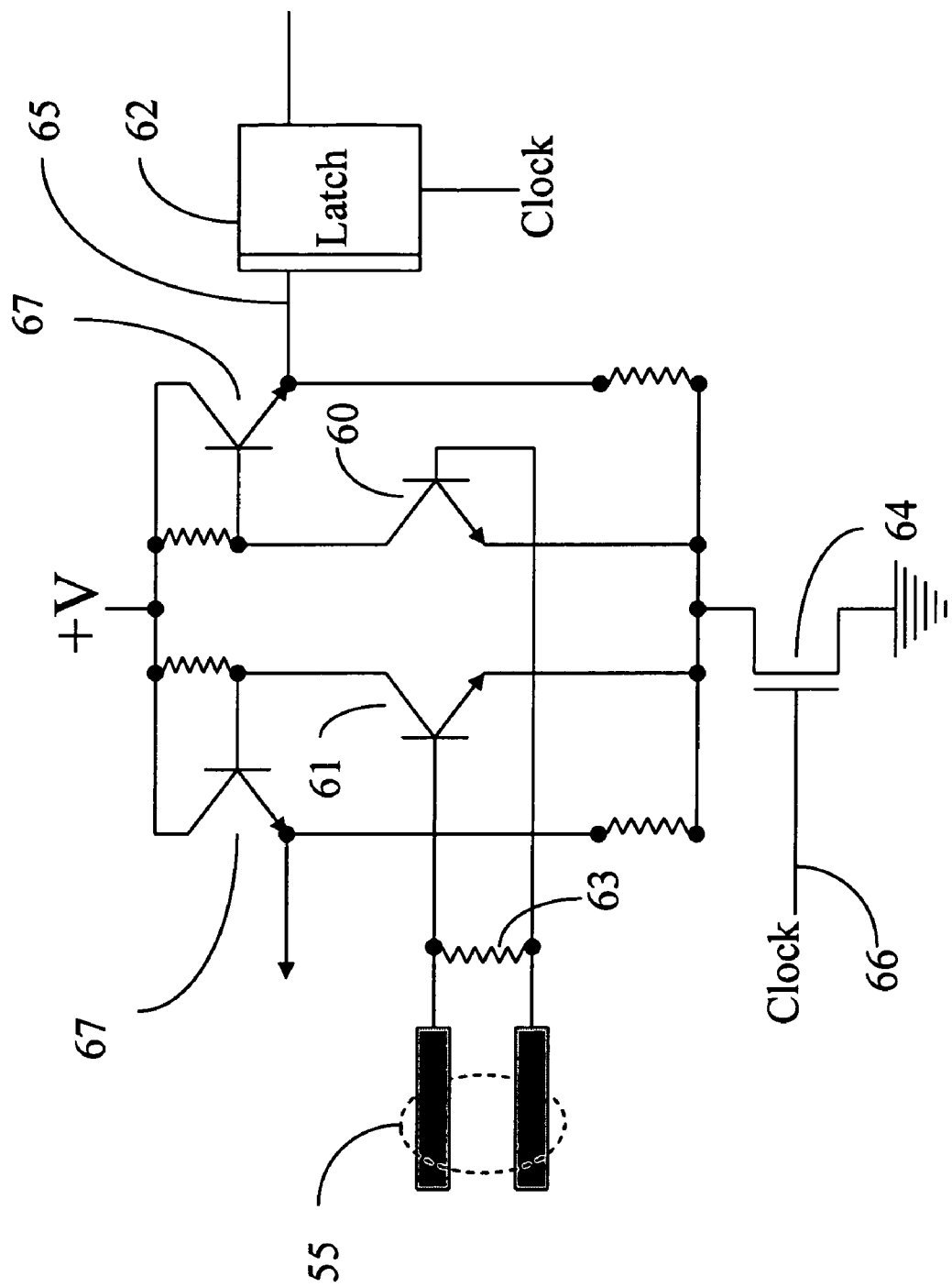
FIG. 6 is a diagram of a differential receiver.

Reference is now made to FIG. 6, an example of a receiver. The differential signals at the receiver are typically both small and high frequency. This requires the receiver to be both sensitive to small changes in current and highly responsive to detect small pulses, but to minimize cost, the receiver presented in "Current Sensing Techniques for Global Interconnects in Very Deep Submicron(VDSM) CMOS", cited in the background section of this disclosure, was constructed out of Complementary Metal Oxide Silicon (CMOS) transistors. Unfortunately, CMOS transistors are not well suited for current sensing. Alternatively, the bipolar transistors 60,61 and 67, shown in this receiver, which are well suited for the application, may be created, in a very deep sub-micron CMOS process, with only two additional implant steps. The differential signal drives the bases of two NPN bipolar transistors 60 and 61. When the transmission lines 55 are at mid voltage, both transistors 60 and 61 are drawing an equal amount of current, so the output 65 is also at some mid voltage. When a differential signal is received, current is injected into the base of one of the transistors and extracted from the other. A very small differential current change will cause this bipolar circuit to switch one side on and the other off. In order to minimize the power consumed while a signal is not present, an N-channel transistor 64 is turned off when the clock signal 66 is low. When the clock signal is high the circuit is powered up to receive the differential signal, which is reflected on the output 65 and captured by a Latch 62, that is also clocked by the same clock signal. In this way the differential signal that is present during the clock is captured, leaving the power off the rest of the time.

Figure 7B:
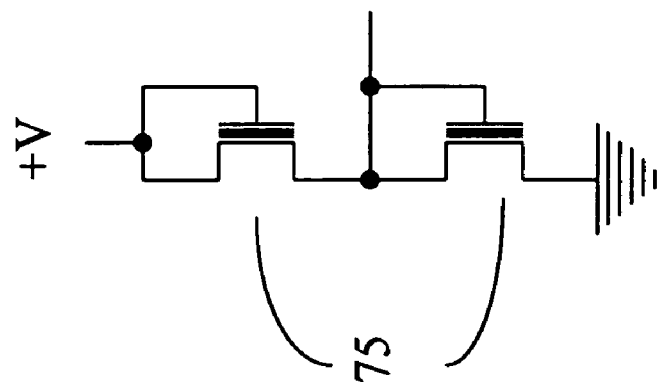
Figure 7A:
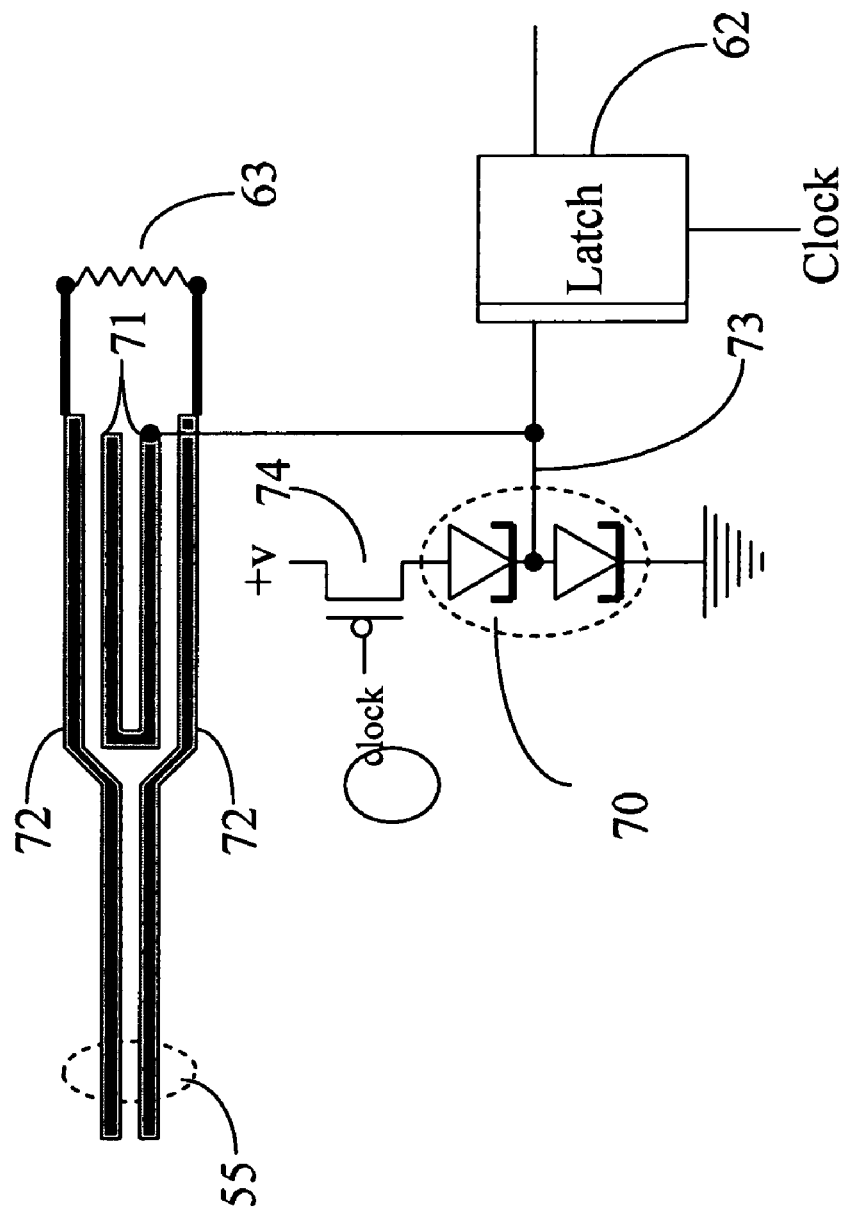
FIG. 7a is a diagram of another differential receiver.

Reference is now made to FIG. 7a, another example of a receiver. In this case a pair of tunnel diodes 70, when powered up set their output 73 to a mid voltage. This output is capacitively and inductively coupled to both sides of the transmission lines 55 with two shorter adjacent lines 71. A change in current on the transmission line causes a corresponding (though smaller) change in current on the adjacent lines 71, which causes the tunnel diodes 70 to drive their output 73 in the direction of the change, toward power or ground. The tunnel diodes need to be powered down and back up to reset them, which is done by a P-channel transistor 74 driven by an inverse clock signal. Also the pair of transmission lines 55, are spaced 72 so the adjacent line 71 is placed to minimize any signal reflections by keeping the characteristic impedance constant. FIG. 7b shows how two tunneling N channel transistors 75 may be connected to form a pair of tunnel diodes. At dimensions below 0.05 microns, with sufficiently thin oxide, they will begin to tunnel when the gate to source-drain voltage is high enough, thus pinching off the current conducting between the source and drain of the transistors.

Figure 8:
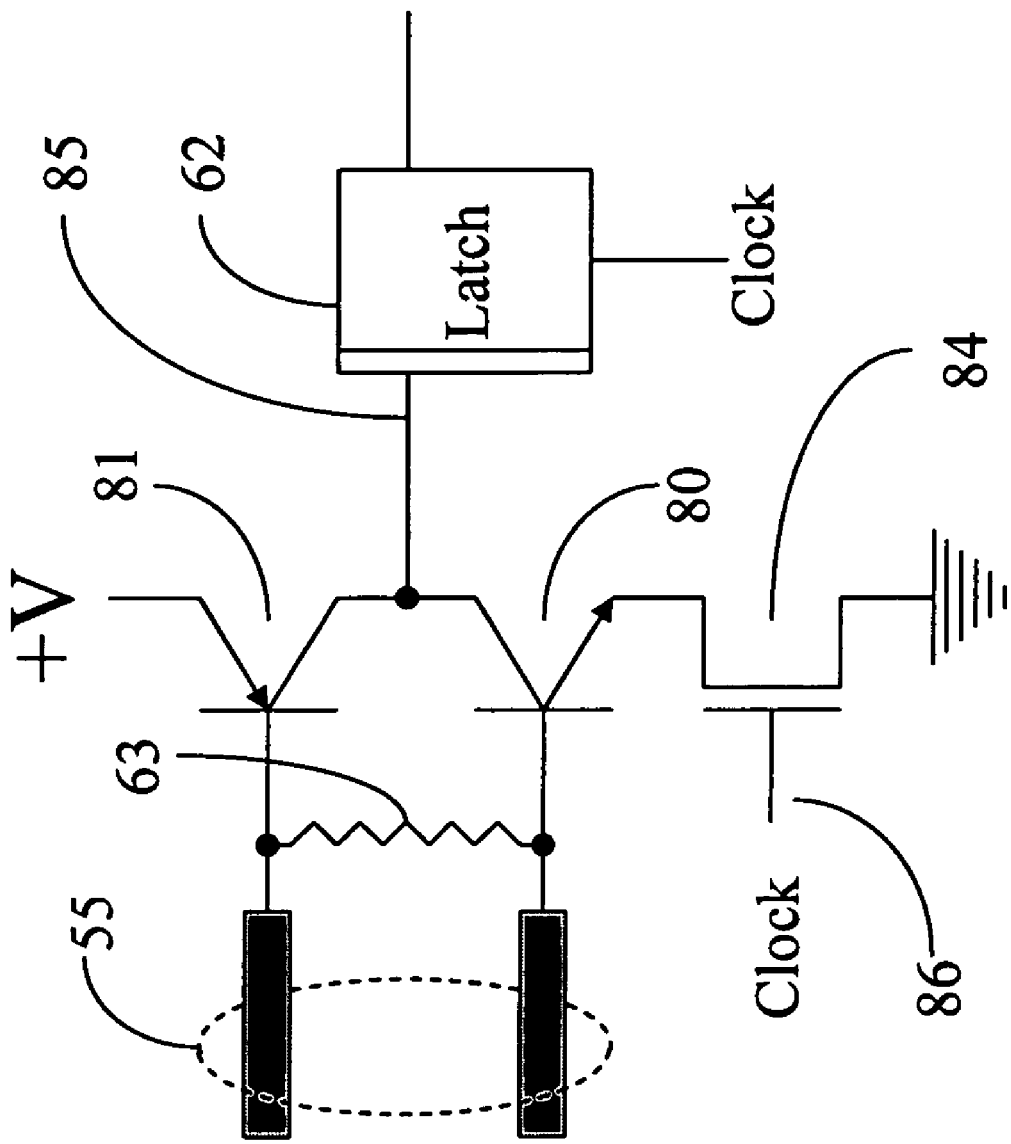
FIG. 8 is a diagram of yet another differential receiver.

Reference is now made to FIG. 8. In this case there is a pair of p and n channel bipolar transistors. At dimensions below .05 micron, it is presumed these are fabricated like CMOS transistors, but without the gate oxide. Unlike the circuit in FIG. 6, at the rails this circuit does not draw much power since one transistor or the other is off, but at some mid voltage, when current is neither injected nor removed from either base, the device does draw current, which still necessitates the presence of the N-channel transistor 84 to gate the power off.

Figure 9A:
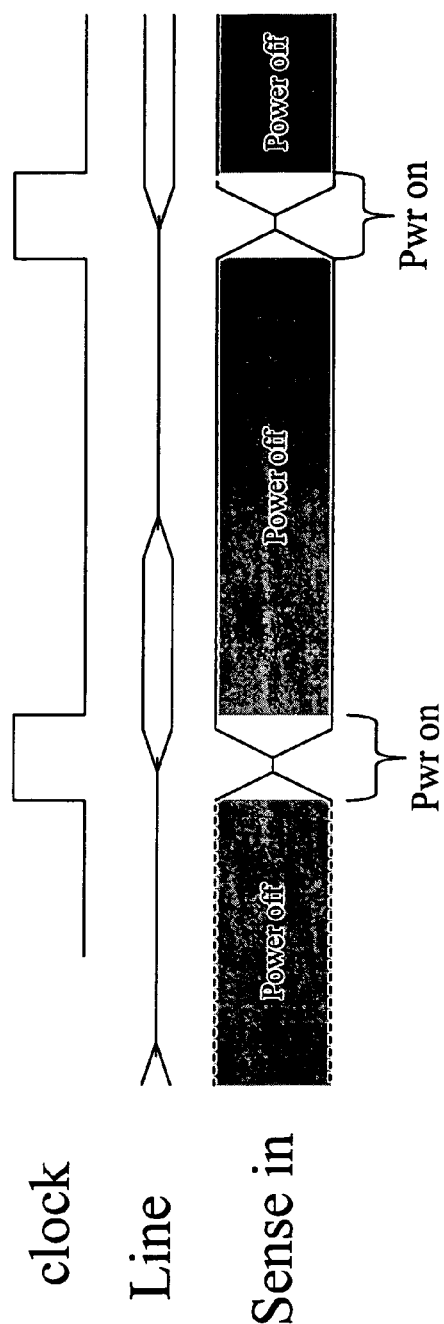
FIG. 9a is a timing diagram of a differential receiver.

Reference is now made to FIG. 9a, a waveform diagram of the receivers shown in FIGS. 6, 7a and 8. In yet another embodiment of the present invention the receiver is only consuming power while the clock is high, and only to accept a differential current pulse from the transmission line. Furthermore the structures shown in FIGS. 6, 7 and 8 will amplify a small differential current pulse into a full voltage swing, because all three examples of these receivers are sensitive to current more than voltage, and as a result they will switch when sufficient current is injected or removed from the bases of the transistors, as close to the initial incidence of the transmission of the signal as possible.

Figure 9B:
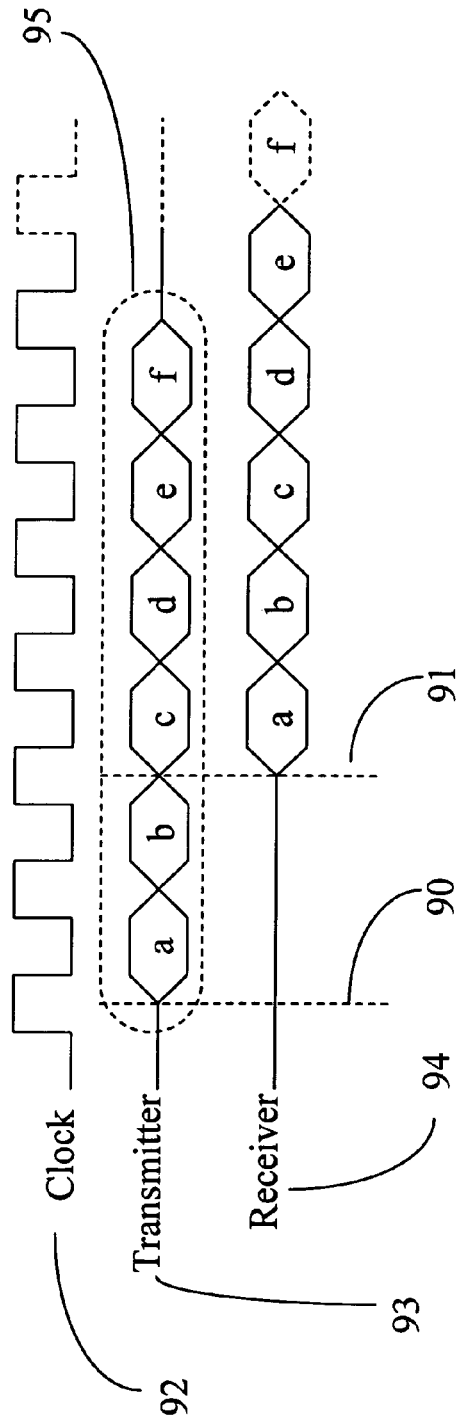
FIG. 9b is a timing diagram of a differential connection with multiple bits of data being transmitted and received.

Reference is now made to FIG. 9b, which is a timing diagram that shows a series of clock pulses 92, a series of six bits of data (a-f) 95 being transmitted by a transmitter 93, and a series of the same six bits of data (a-f) being received by a receiver 94. When signals can be successively generated at clock rates that exceed 10 GHz, the propagation time from a transmitter 93 to a receiver 94 that are separated by 30 mm, the rectilinear distance, from corner to corner, across a 1.5 cm chip, is about 200 ps or more. As such, each signal's duration is less than half the propagation time down the whole transmission line. Therefore, in yet another embodiment of the present invention multiple signal transitions may be transmitted down the differential transmission line at the same time, without intervening circuitry, thus allowing the "pipelining" of signals between the transmitter and receiver at clock speeds that are much faster than propagation time of a traditional capacitive charged line. In this case the transmission of the first bit begins at a time 90 and is received at a time 91, which is coincident with the transmission of the third bit.

Figure 10:
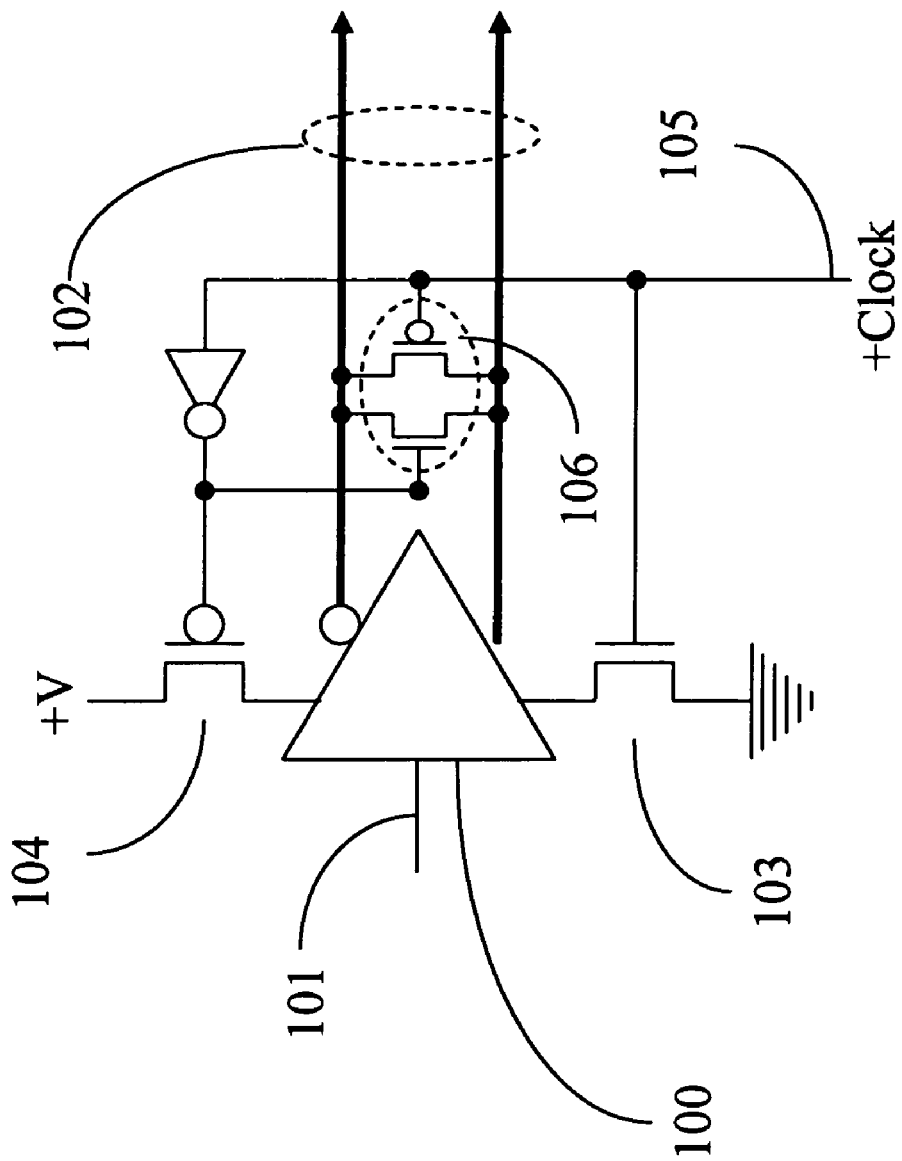
FIG. 10 is a diagram of a clocked differential transmitter.

Reference is now made to FIG. 10, a clocked differential transmitter. The transmitter consists of a differential driver 100 that takes a signal from its input 101 and creates a set of differential current pulses on its outputs 102, for transmission down the differential pair of global wires. When the +Clock input 105 is high the differential driver is powered on through a P-Channel 104 and N-Channel 103 pair of transistors. When the +Clock input 105 is low, a pair of P and N channel transistors 106 shunt the differential wires together to ensure they are at some mid voltage between power and ground while the differential driver is off. In this manner, power is minimized while the clock is low and the differential transmitter is not transmitting, and the differential pair of wires are set to the optimal voltage for subsequent high performance transmission of signals when the clock is turned back on.

Figure 11A:
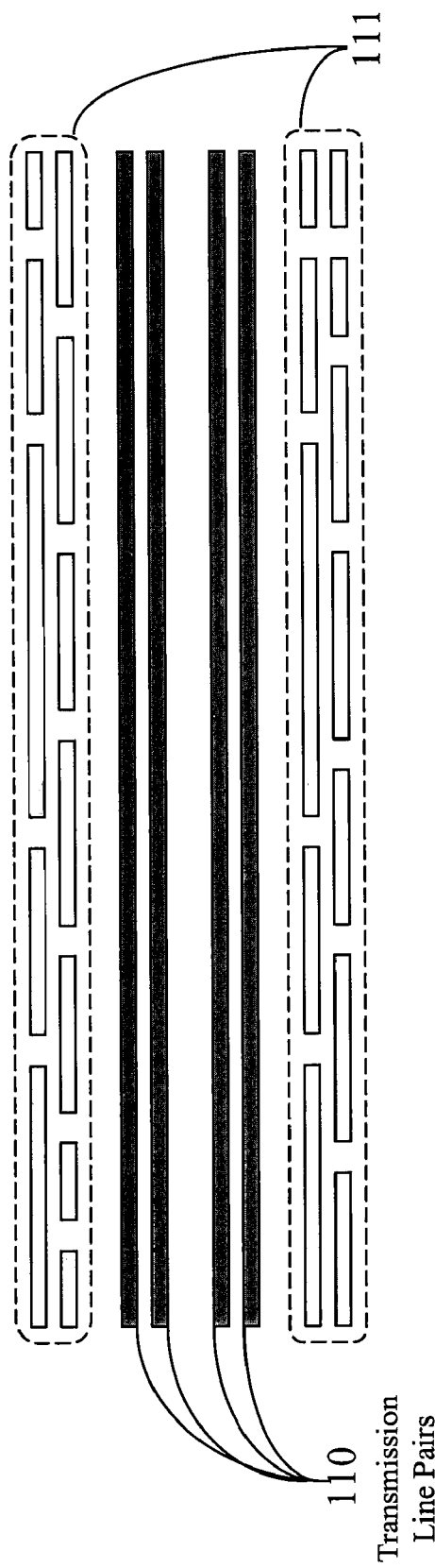
FIG. 11a is a top view diagram of a single layer of metal on an IC; with spaces between pairs of differential connections.
Figure 11B:
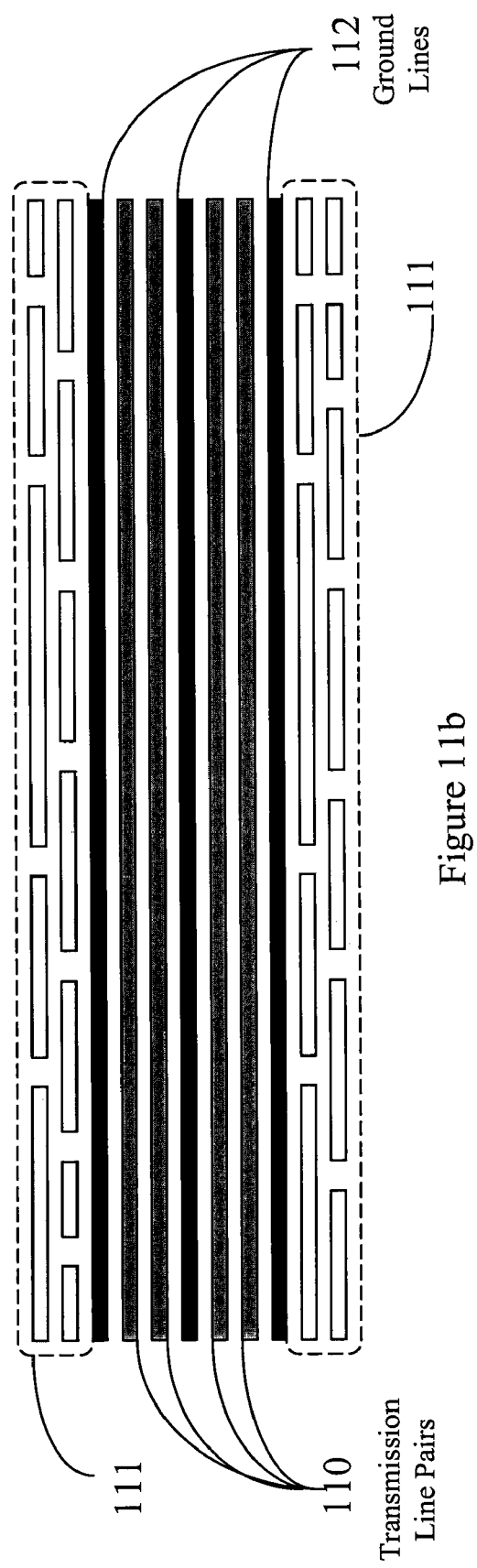
FIG. 11b is a top view diagram of a single layer of metal on an IC with ground lines between pairs of differential connections.

Reference is now made to FIGS. 11a and 11b, which show two transmission line pairs 110, separated by ground lines 112 in FIG. 11b and open space in FIG. 11a from shorter segments 111 and from each other. In yet another embodiment of the present invention the noise from other signal wires, including other transmission lines is kept low enough to ensure first incident switching of the differential receivers regardless of the attenuation of the transmitted signals due to the resistive characteristics of the lines by either shielding the transmission line pairs, or keeping them 3 times their separation apart from the other signals.

In yet another preferred embodiment, an automatic process for selecting appropriate global signals and transforming them into differentially transmitted global signals may be used.

Figure 12C:
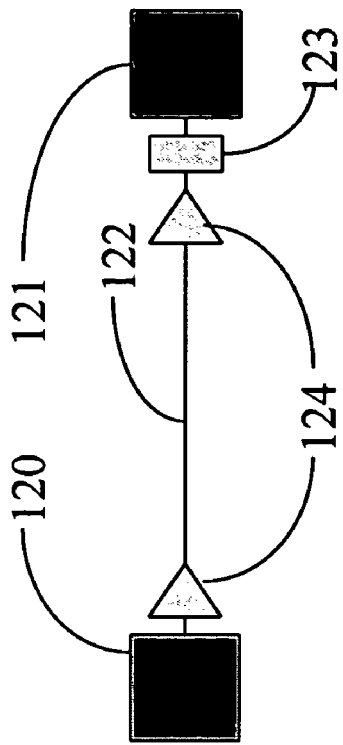
FIG. 12c is FIG. 12b with the addition of repeaters.
Figure 12D:
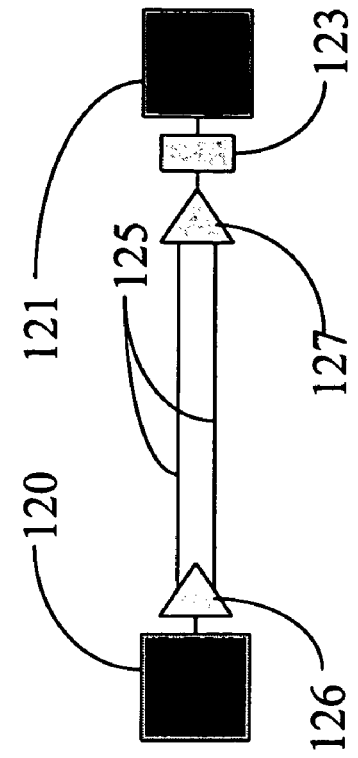
FIG. 12d is FIG. 12a with differential connections in place of the wire.
Figure 12A:
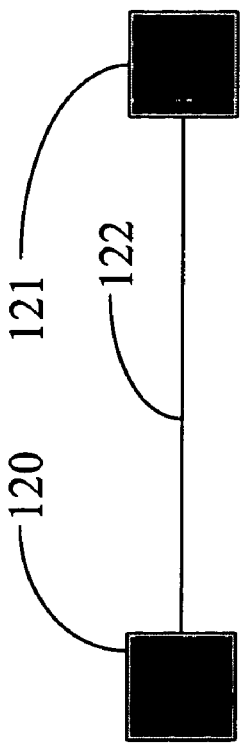
FIG. 12a is a diagram showing two blocks and a signal wire.

Reference is now made to FIG. 12a. Whether the high level design of a large design is manually constructed or generated with a layout oriented synthesis process, the high level functions are typically organized into blocks, and signal wires 122 between them, with as little logic as necessary from the output of the transmitting block 120 to the input of the receiving block 121 to allow for the transmission delay. This means a flip-flop or latch is usually inserted within the receiving block 121, to capture the transmitted signal before the end of the clock cycle. The following steps may then be done to properly insert differentially transmitted global signals where necessary.

Figure 12B:
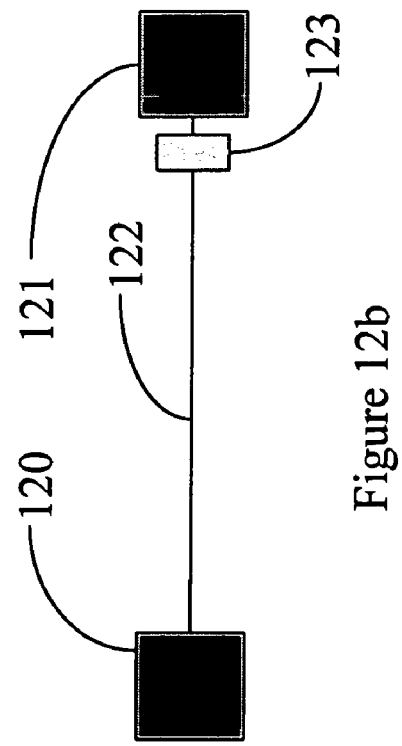
FIG. 12b is FIG. 12a with the addition of a register.

Reference is now made to FIG. 12b. Following this initial partitioning and block placement, the flip-flops or latches (hereafter called registers) that receive global signals 123 are moved from the receiving blocks 121 out to the global level, to facilitate timing related synthesis operations.

Reference is now made to FIG. 12c. If the delay of the signal on the global wire 122 exceeds the delay of the clock signal that captures the signal in the register 123, one or more repeaters 124 may be inserted along the global wire as necessary to meet the timing requirements at the register. On the other hand, if the insertion of repeaters 124 either becomes too costly in silicon space or fails to meet the required timing, instead the wire may be replaced with differential high speed logic.

Reference is now made to FIG. 12d. Here the wire has been replaced with a differential transmitter 126, a pair of wires 125 and a differential current sensing receiver 127, as described in prior figures. The pair of wires 125, are marked to ensure they are placed and routed together with the necessary spacing or ground shielding around them after detailed placement and routing. In this manner the high speed differential transmission technique may be automatically applied to the global signals of a large semiconductor design as needed.

Figure 13:
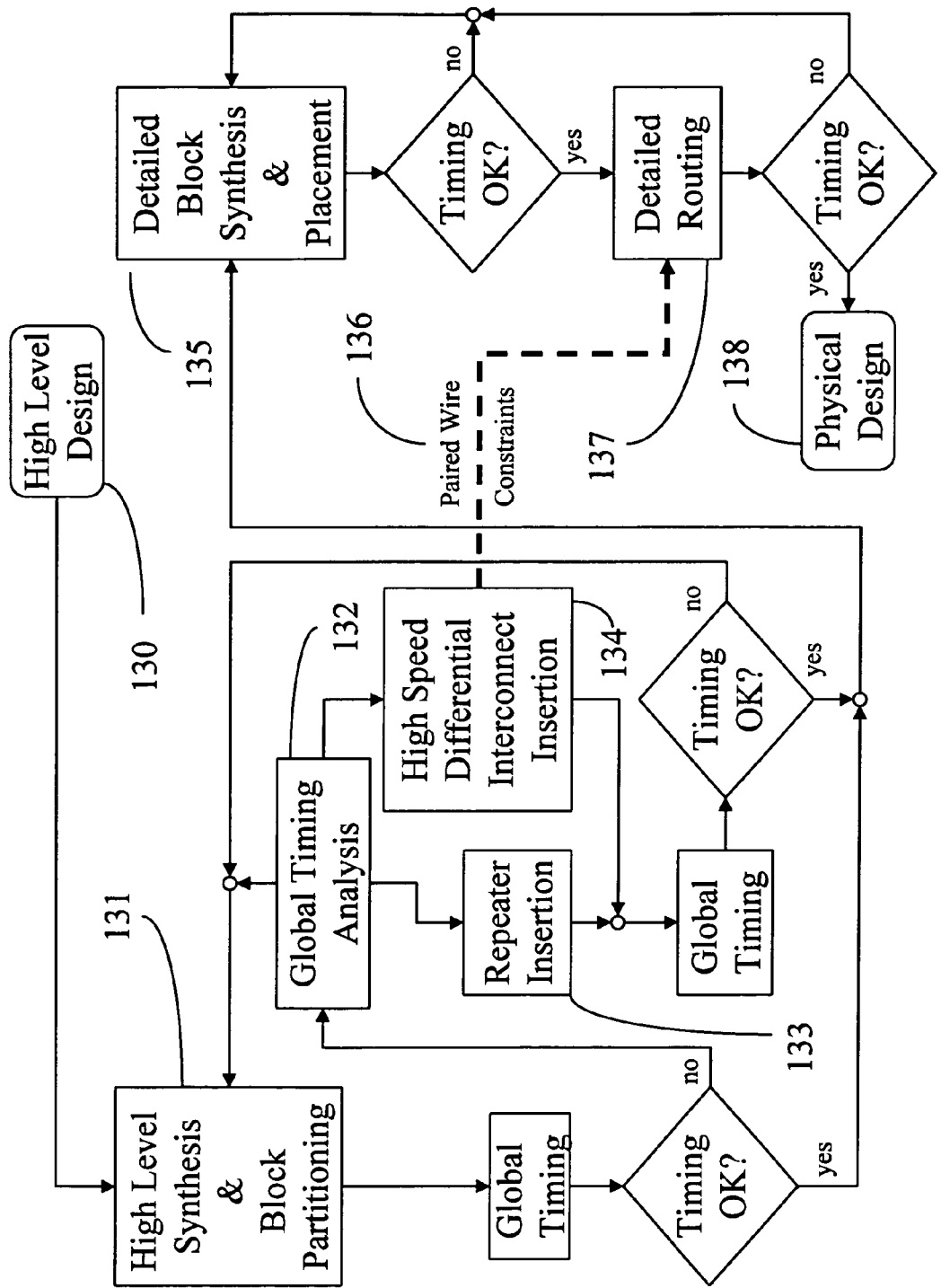
FIG. 13 is a flow chart for the steps to insert high speed global interconnect.

Reference is now made to FIG. 13, a flow chart of the steps for replacing global interconnects with differential high speed connections where needed. Starting with a high level design 130, high level synthesis and block partitioning is performed 131. Analysis of the global timing 132 of the design determines if either repeater insertion 133, or high speed differential interconnect insertion 134 should be applied to one or more of the global interconnects depending on how much performance is needed. If neither option will be sufficient or the chosen option is insufficient to correct the timing problems, high level synthesis and block partitioning is again applied to correct the timing problems. If the global timing is okay, detailed block level synthesis and placement 135 is performed on the design, and if necessary repeated until the detailed timing is okay, after which detailed routing 137 is performed on the design. Detailed routing reads in the paired wire constraints from the high speed differential interconnect insertion to ensure the wires are routed in a continuously paired fashion with adequate space or grounding around them over the whole routing of the wires. If the post route detailed timing is acceptable, the physical design 138 is complete.

Figure 14:
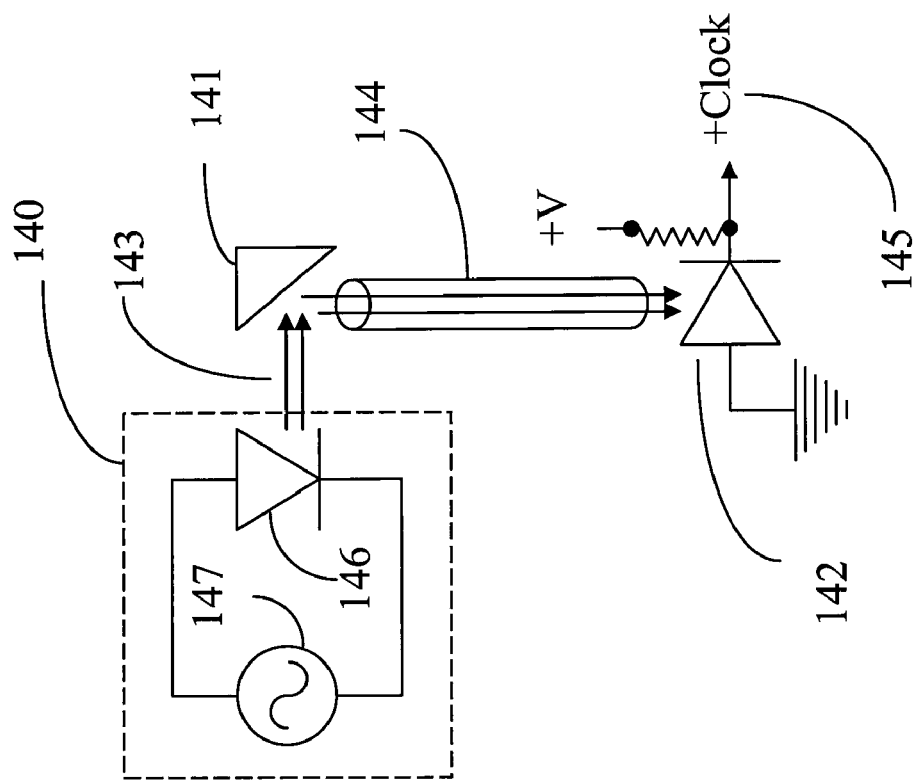
FIG. 14 is a diagram of an optical clock distribution system.

Reference is now made to FIG. 14. With high speed global interconnect it is necessary to minimize the skew of the clocks. This may be done by creating a balanced H tree such as described by Cooke and Venkatramani in U.S. Pat. No. 6,651,237, issued on Nov. 18, 2003, but the metal structures are still subject to delay variations due to differences in adjacent wire capacitance. Another alternative would be to generate optical pulses from a separate chip 140, consisting of a high speed LED 146 and an oscillator 147, distribute the pulses 143 on a modified cover glass layer down through optical vias 144 by reflection off of angled mirrors 141 to light sensitive PIN diodes 142 from which local clocks 145 distribute the resulting electrical pulses.

Figure 15:
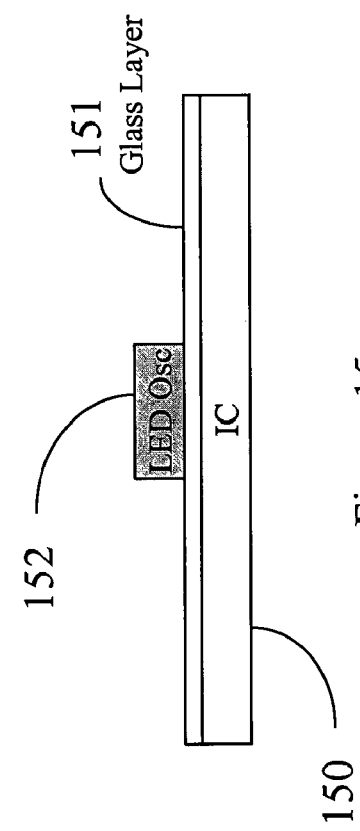
FIG. 15 is a diagram of an IC with an LED oscillator chip attached.

Reference is now made to FIG. 15. Such a structure can be most economically produced by constructing the special cover glass layer 151 on the top of the integrated circuit chip 150 and mounting the LED oscillator chip 152 directly on top of the existing IC, aligning the chip to existing power and ground pads placed specifically for the optical clock generator.

Figure 16:
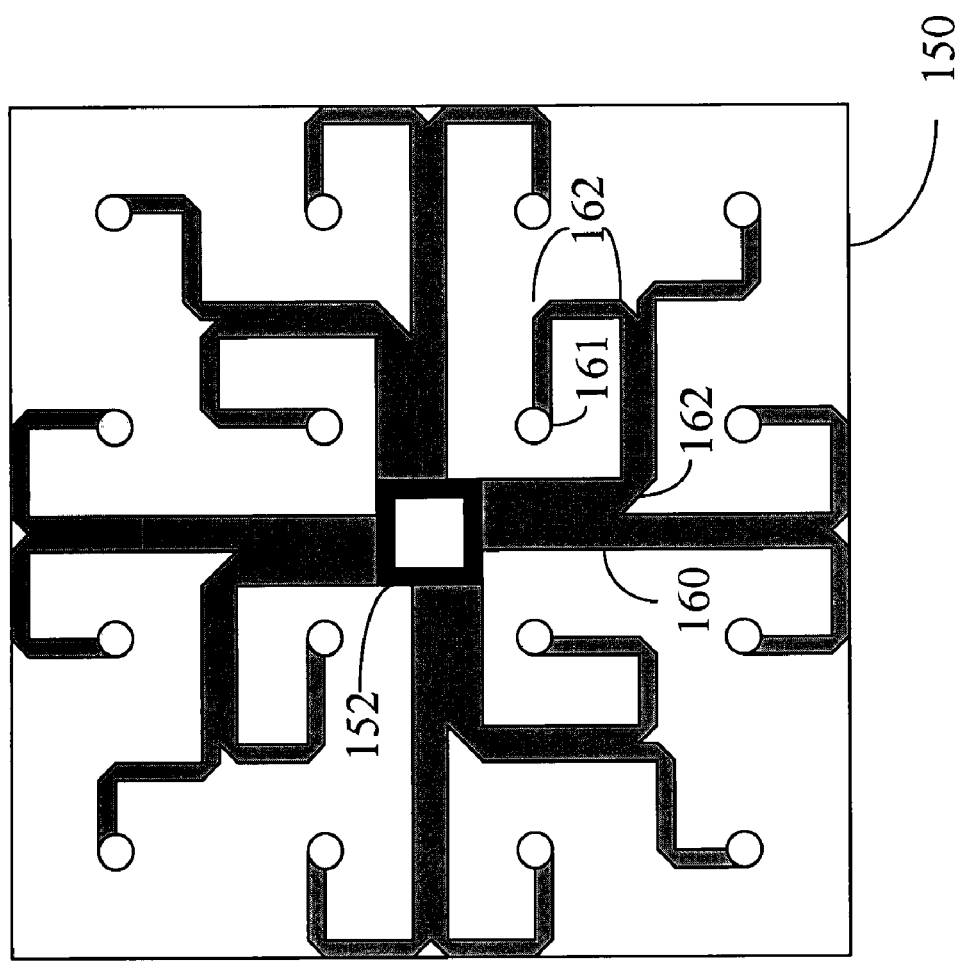
FIG. 16 is a diagram of the layout of an optical clock distribution.

Reference is now made to FIG. 16. The H Tree layout technique mentioned above may be employed to distribute the optical signal from the optical clock generator chip 152, mounted in the center of the IC 150, through four balanced H-Tree structures 160, which split the light pulses, reflecting them with angled edges 162 to the regularly placed light vias 161, with equal distances from the optical clock generator chip 152 to each of the light vias 161. Since the light pulses are not delayed by variations in the metal capacitance, the equal distance H Tree routing minimizes the resulting skew much more effectively than with electrical signals.

So, in yet another embodiment of the present invention, an optical clock distribution system may be used to distribute the clock to the registers, which capture the results from the differential receivers.

It will be appreciated by persons skilled in the art that the present invention is not limited by what has been particularly shown and described hereinabove. Rather the scope of the present invention includes both combinations and sub-combinations of various features described hereinabove as well as modifications and variations which would occur to persons skilled in the art upon reading the foregoing description and which are not in the prior art.

We claim:

1. A semiconductor device comprising:
   a first logic block and a second logic block, and a high speed connection for transferring logic information from said first logic block to said second logic block, wherein said second logic block comprises a register to capture said information; and
   a clock distribution system for distributing a clock signal, wherein said clock signal is used to synchronize the powering of said receiver and the timing of said capturing;
   wherein said logic information is represented by a direction of current flow in said high speed connection, wherein said second logic block comprises a receiver to convert said direction of current flow to a voltage level logic representation, and wherein said receiver is powered for small periods of time to save circuit power.

2. A semiconductor device according to claim 1, wherein said clock distribution system distributes the clock using pulses of light.

3. A semiconductor device according to claim 1, wherein said high speed connection comprises two wires.

4. A semiconductor device according to claim 3, wherein said two wires are spaced from adjacent signal carriers by a spacing greater than a spacing between said two wires.

5. A semiconductor device according to claim 4, comprising repeaters to redrive the signals on said two wires.

6. A semiconductor device according to claim 1, wherein said first logic block comprises a transceiver to convert a voltage level logic representation to said direction of current flow.

7. A semiconductor device according to claim 1, wherein said clock is further used to synchronize said transceiver.

8. The semiconductor device as in claim 1, wherein said high speed connection further comprises:
a differential driver, and
at least one clocked current sensing receiver;
wherein said differential driver, said two wires, and said current sensing receiver are connected to transmit differential current pulses representing data from said differential driver and to receive said differential current pulses at said receiver when said receiver is clocked.

9. The semiconductor device as in claim 8, wherein said current sensing receiver comprises:
differential inputs,
a clock input,
a latch, and
a differential receiver;
wherein said differential receiver is disabled by a signal on said clock input, to reduce the power consumed by said current sensing receiver when not receiving data.

10. The semiconductor device as in claim 8, wherein said differential driver transmits multiple bits of data consisting of said differential current pulses on said two wires prior to said current sensing receiver receiving the first of said current pulses.

11. The semiconductor device as in claim 8, wherein said two wires are separated from other wires of said semiconductor device by a distance greater than the spacing between said two wires.

12. The semiconductor device as in claim 8, wherein said two wires are separated from other wires of said semiconductor device by one or more wires connected to ground.

13. A semiconductor device comprising:
a first logic block and a second logic block, and a high speed connection for transferring logic information from said first logic block to said second logic block, wherein said first logic block comprises a transceiver to convert a voltage level logic representation to said direction of current flow; and
a clock distribution system, wherein said clock is used to synchronize said transceiver and the powering of said receiver;
wherein said logic information is represented by a direction of current flow in said high speed connection, wherein said second logic block comprises a receiver to convert said direction of current flow to a voltage level logic representation, and wherein said receiver is powered for small periods of time to save circuit power; and
wherein said clock distribution system distributes the clock using pulses of light.

14. A semiconductor device comprising:
a first logic block and a second logic block, and a high speed connection for transferring logic information from said first logic block to said second logic block, said high speed connection comprising two wires; and
a clock distribution system for distributing a clock signal, wherein said clock signal is used to synchronize the powering of said transmitter;
wherein said logic information is represented by a direction of current flow in said high speed connection, wherein said first logic block comprises a transmitter to convert voltage level logic representations to directions of current flow, and wherein said transmitter is powered for small periods of time to save circuit power; and
wherein said clock distribution system distributes the clock using pulses of light.

15. A semiconductor device comprising:
a first logic block and a second logic block, and a high speed connection for transferring logic information from said first logic block to said second logic block, said high speed connection comprising two wires;
wherein said logic information is represented by a direction of current flow in said high speed connection, wherein said first logic block comprises a transmitter to convert voltage level logic representations to directions of current flow, and wherein said transmitter is powered for small periods of time to save circuit power; and
wherein said transmitter shunts said two wires together when said transmitter is not in a powered state.

16. The semiconductor device as in claim 15, wherein said high speed connection further comprises:
a differential driver, and
at least one clocked current sensing receiver;
wherein said differential driver, said two wires, and said current sensing receiver are connected to transmit differential current pulses representing data from said differential driver and to receive said differential current pulses at said receiver when said receiver is clocked.

17. The semiconductor device as in claim 16, wherein said current sensing receiver comprises:
differential inputs,
a clock input,
a latch, and
a differential receiver;
wherein said differential receiver is disabled by a signal on said clock input, to reduce the power consumed by said current sensing receiver when not receiving data.

18. The semiconductor device as in claim 17, wherein said differential driver transmits multiple bits of data consisting of said differential current pulses on said two wires prior to said current sensing receiver receiving the first of said current pulses.

19. The semiconductor device as in claim 17, wherein said two wires are separated from other wires of said semiconductor device by a distance greater than the spacing between said two wires.

20. The semiconductor device as in claim 17, wherein said two wires are separated from other wires of said semiconductor device by one or more wires connected to ground.

21. A semiconductor device according to claim 15, further comprising a clock distribution system for distributing a clock signal, wherein said clock signal is used to synchronize the powering of said transmitter.

* * * * *